(12) United States Patent
Ueda et al.

(10) Patent No.: US 9,775,268 B2
(45) Date of Patent: Sep. 26, 2017

(54) RECEIVING DEVICE AND SHIELD CASE CONNECTION METHOD

(71) Applicant: Panasonic Intellectual Property Management Co., Ltd., Osaka (JP)

(72) Inventors: Isao Ueda, Osaka (JP); Toshitaka Suma, Osaka (JP); Akio Takeuchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 58 days.

(21) Appl. No.: 14/527,177

(22) Filed: Oct. 29, 2014

(65) Prior Publication Data

US 2015/0181773 A1 Jun. 25, 2015

(30) Foreign Application Priority Data

Dec. 20, 2013 (JP) .................. 2013-263438

(51) Int. Cl.
*H05K 9/00* (2006.01)
(52) U.S. Cl.
CPC .......... *H05K 9/0028* (2013.01); *H05K 9/003* (2013.01); *H05K 9/0024* (2013.01); *H05K 9/0037* (2013.01); *H05K 2201/10371* (2013.01); *Y10S 174/35* (2013.01); *Y10T 29/49124* (2015.01)
(58) Field of Classification Search
CPC ....... H05K 2201/10371; H05K 9/0028; H05K 9/003; H05K 9/0037; H05K 9/0024; Y10S 174/35

USPC ........ 361/800, 816, 818, 753; 174/350, 377, 174/384, 387; 331/67
See application file for complete search history.

(56) References Cited

U.S. PATENT DOCUMENTS

| 5,828,555 A * | 10/1998 | Itoh ...................... H05K 1/0221 174/254 |
| 2012/0019731 A1* | 1/2012 | Imai ........................ H04N 5/50 348/726 |
| 2012/0104570 A1* | 5/2012 | Kim ...................... H01L 23/552 257/659 |
| 2012/0320559 A1* | 12/2012 | Kimura ................. H01L 23/552 361/818 |
| 2013/0083495 A1* | 4/2013 | Moon ...................... H04N 5/64 361/736 |

FOREIGN PATENT DOCUMENTS

| JP | 04-070794 | 6/1992 |
| JP | 10-326993 | 12/1998 |
| JP | 2010-192756 | 9/2010 |
| JP | 2010-245225 | 10/2010 |

* cited by examiner

*Primary Examiner* — James Wu
(74) *Attorney, Agent, or Firm* — Wenderoth, Lind & Ponack, L.L.P.

(57) ABSTRACT

A receiving device includes a shield case which is in a hollow box shape that is open on one side. The shield case reduces external interfering signals which interfere with an input signal of a broadcast wave. A printed wiring board includes a conductive portion that is electrically connected with an electronic component. A soldered portion is formed along a protrusion-free linearly extending side of an opening edge of the shield case. The soldered portion electrically connects with solder the shield case and the conductive portion.

13 Claims, 22 Drawing Sheets

RECEIVING DEVICE AND SHIELD CASE CONNECTION METHOD

CROSS REFERENCE TO RELATED APPLICATION

The present application is based on and claims priority of Japanese Patent Application No. 2013-263438 filed on Dec. 20, 2013. The entire disclosure of the above-identified application, including the specification, drawings and claims is incorporated herein to by reference in its entirety.

FIELD

The present disclosure relates to a receiving device and to a shield case connection method.

BACKGROUND

In Patent Literature (PTL) 1, a shield case is connected to (mounted on) a printed wiring board by applying, along an outer edge of the shield case, presolder in an area outside of a side where a bottom edge of a side surface of the shield case and the printed wiring board are in contact with each other, and melting and solidifying the presolder. In this manner, a position of the shield case is fixed, and mounting accuracy of the shield case is improved.

CITATION LIST

Patent Literature

[PTL 1]
Japanese Unexamined Patent Application Publication No. 2010-192756

SUMMARY

Technical Problem

The present disclosure provides (i) a shield case connection method which enables to connect, with decreased impedance, a shield case and a conductive portion of a printed wiring board, and (ii) a receiving device including a shield case which enables to strengthen resistance to interference from outside.

Solution to Problem

A receiving device according to the present disclosure includes: a shield case which is in a hollow box shape that is open on one side, the shield case reducing external interfering signals which interfere with an input signal of a broadcast wave; and a printed wiring board including a conductive portion that is electrically connected with an electronic component, wherein a soldered portion is formed along a side of an opening edge of the shield case, the soldered portion electrically connecting with solder the shield case and the conductive portion of the printed wiring board.

Furthermore, a shield case connection method according to the present disclosure is a method in which a shield case in a hollow box shape that is open on one side is connected, with solder, to a conductive portion to which an electronic component of a printed wiring board is connected with solder, the shield case reducing external interfering signals which interfere with an input signal of a broadcast wave, the method including: forming, along a side of an opening edge of the shield case, a land that penetrates a resist in a thickness direction, the resist being provided on a surface layer of the printed wiring board; applying solder paste on the land that is formed; disposing the shield case on the printed wiring board such that the solder paste and the side of the opening edge are in contact with each other; and applying heat to melt the solder paste, and subsequently cooling the melted solder paste, to connect with solder the shield case and the conductive portion of the printed wiring board.

Advantageous Effects

A receiving device and a shield case connection method according to the present disclosure enables, without significant increase in the number of components and man-hour, decreased impedance between a shield case and a conductive portion which is connected to a ground of a printed wiring board. This makes it possible to enhance resistance to interference from an unwanted external signal, and improve reception performance of the receiving device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION

Figure 1:
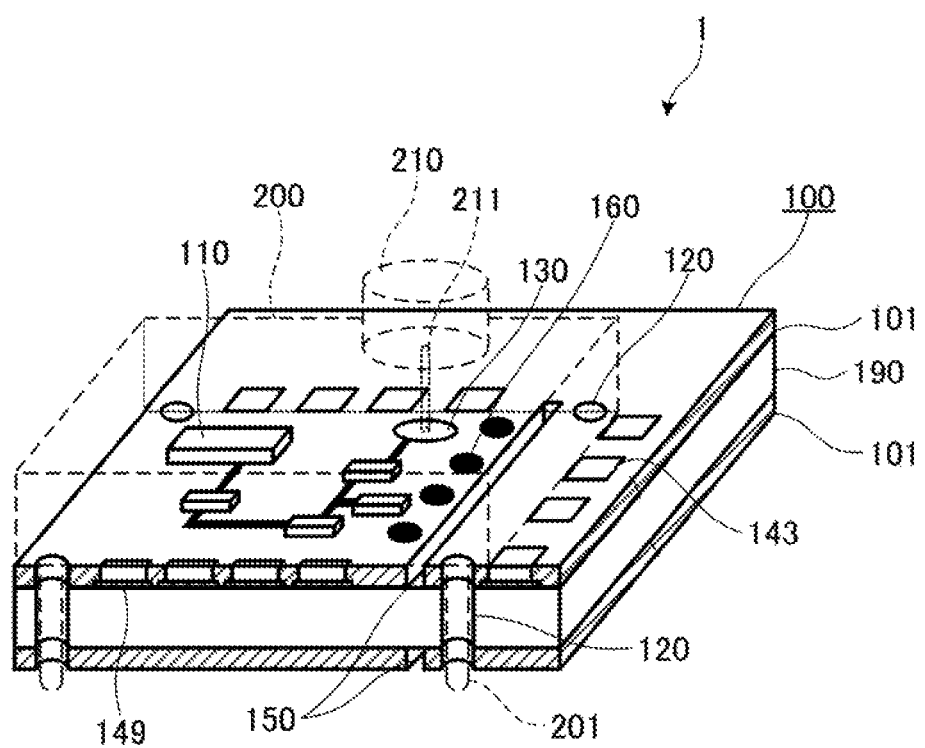
FIG. 1 is a perspective view illustrating a configuration of a receiving device according to Embodiment 1.

The following describes, in detail, non-limiting embodiments with reference to the drawings. Note that, details beyond necessity are sometimes omitted. For example, detailed descriptions of matters which are already well known or a repeated description for a substantially same configuration may be omitted. This is to avoid making the following description to be unnecessarily redundant and to facilitate the understanding of those skilled in the art.

It should be noted that the inventors provide the attached drawings and the following description to enable those skilled in the art to sufficiently understand the present disclosure, and do not intend to limit subject matter described in the CLAIMS by such drawings and the description.

A conventional receiving device includes, for example, a printed wiring board, a radio frequency (RF) component, a through hole into which a protrusion of a shield case is inserted, a core wire connection portion, and the shield case.

The shield case is included in the receiving device, so called tuner frame that includes an input connector, and includes a protrusion.

Here, the input connector is a connector to which a coaxial cable or the like is connected that can carry an RF signal of, for example, a broadcast wave. When the input connector is attached to a shield case, an outer perimeter portion of the input connector is electrically connected to the shield case. Furthermore, the input connector includes, at a center of the outer perimeter portion, a core wire that is provided in electrical isolation from the outer perimeter portion and the shield case.

The RF component and the shield case are mounted on the printed wiring board, and thus a receiving device that can receive broadcast waves is realized. Furthermore, another component is mounted on the printed wiring board, and thus another signal processing system is also realized. The printed wiring board includes (i) a core wire connection portion, as a joining portion for attaching the core wire of the input connector provided on the shield case, into which the core wire of the input connector is inserted and (ii) a through hole which is for the protrusion and into which the protrusion is inserted.

The shield case includes: the input connector that is connected to a cable through which broadcast waves are carried; and the protrusion to be inserted to the printed wiring board.

In an exemplary method (mounting method) of connecting with solder the printed wiring board and the shield case or the like, solder paste in a paste form is applied to the printed wiring board, and the shield case or the like is placed on the applied solder paste. In this state, heating is performed using a reflow furnace or the like and then cooling is performed to connected with solder the printed wiring board and the shield case. In view of this, the following mainly describes characteristic portion for improving performance and function as the receiving device, with the shield case automatically mounted on a printed wiring board by a machine and connection using solder automatically achieved using the reflow furnace.

FIG. 1 is a perspective view illustrating a configuration of a receiving device according to non-limiting Embodiment 1.

Figure 2:
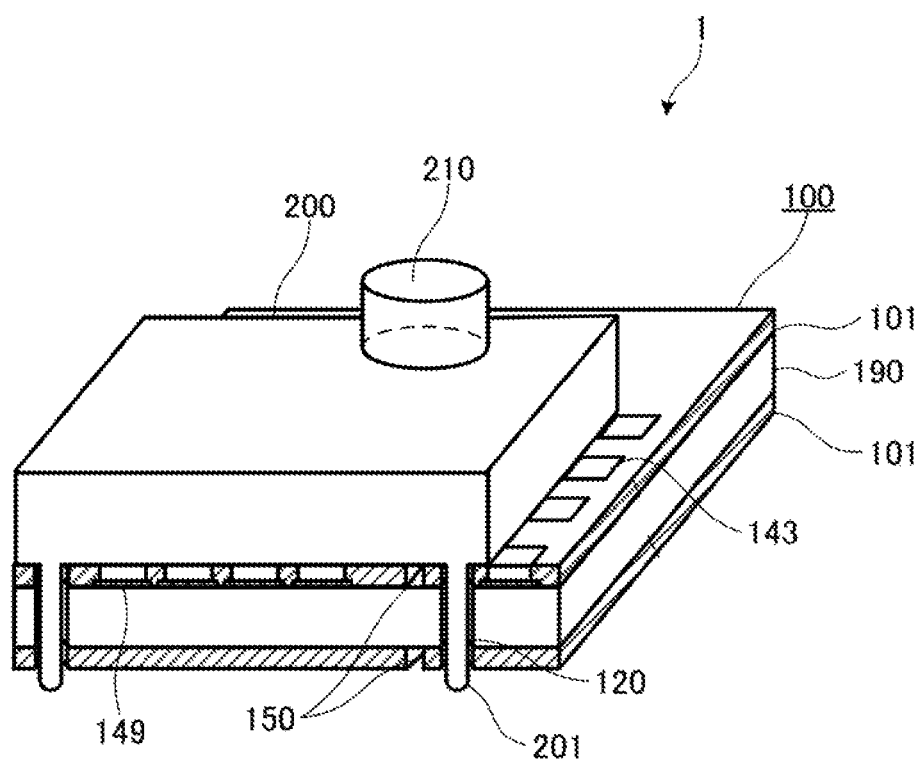
FIG. 2 is a perspective view illustrating appearances of the receiving device according to Embodiment 1.

FIG. 2 is a perspective view illustrating appearances of the receiving device according to Embodiment 1.

Figure 3:
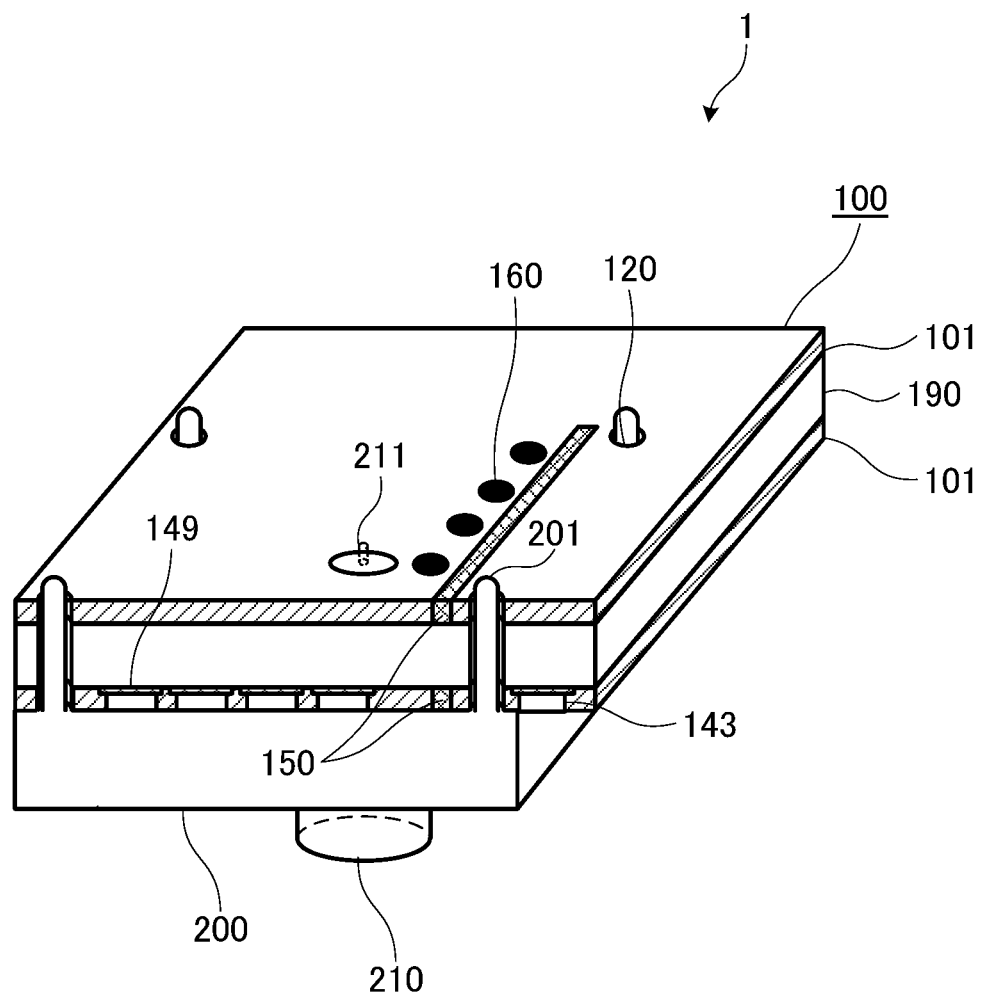
FIG. 3 is a perspective view illustrating, from a rear side of a printed wiring board, appearances of the receiving device according to Embodiment 1.

FIG. 3 is a perspective view illustrating, from a rear side of a printed wiring board, appearances of the receiving device according to Embodiment 1.

In FIG. 1, FIG. 2, and FIG. 3, a receiving device 1 includes: a printed wiring board 100, an RF component 110, a through hole 120 for a protrusion 201 of a shield case 200, a core wire connection portion 130 (input connector insertion hole), the shield case 200, a slit 150, and a ground via 160.

The printed wiring board 100 includes: a base board 190 which becomes a structural base; and a resist 101 that is a dielectric disposed to cover a surface of the base board 190. Furthermore, on a surface of the base board 190 and between the base board 190 and the resist 101, conductive portions 149 including conductive foil or the like electrically connects electronic components or the like provided in a predetermined pattern.

The shield case 200 is in a rectangular-box shape that is open at least on one side. In a position where the printed wiring board 100 and an opening edge of the shield case 200 contact with each other when the shield case 200 is mounted on the printed wiring board 100, the printed wiring board 100 includes a plurality of lands 143 that are formed by boring, to penetrate in a thickness direction, the resist 101 on the printed wiring board 100. Furthermore, an area in which the lands 143 are provided is referred to as a land area.

At portions corresponding to the lands 143, the soldered portion 140 is provided at a plurality of positions that is formed by applying, heating, and cooling solder paste 142 to provide electrical conduction to the conductive portion 149 of the printed wiring board 100.

The printed wiring board 100 includes the slit 150 in a position inside the shield case 200 and between the core wire connection portion 130 and the land area that corresponds to the opening edge of the shield case 200 to be mounted. The slit 150 divides the conductive portion 149 and blocks electrical conduction over the divided portion. The slit 150 is formed by boring the resist 101. It should be noted that, although the slit 150 blocks direct electrical conduction over the slit 150, the conductive portion 149 divided by the slit 150 is electrically conductive bypassing the slit 150.

The printed wiring board 100 includes a plurality of the ground vias 160 which are between the slit 150 and the core wire connection portion 130, and are disposed along the slit 150. Each of the ground vias 160 is, for example, a portion that electrically connects, in a thickness direction of the printed wiring board 100, portions that are connected to a ground (GND) of the conductive portions 149 provided on both surfaces of the base board 190. The ground via 160 is provided to penetrate a plurality of layers of the printed wiring board 100.

Here, the ground in this embodiment means a signal ground. It should be noted that the ground is not limited to a signal ground but may be a frame ground or an earth.

The soldered portion 140 is a portion resulting from the melting and the subsequent solidifying of the solder paste 142 that is applied to connect the opening edge of the shield case 200 and the conductive portion 149 of the printed wiring board 100, which is achieved by applying, using a reflow furnace or the like, heat to and then cooling the printed wiring board 100 to which the shield case 200 is attached. The soldered portion 140 mechanically and electrically connects the conductive portion 149 of the printed wiring board 100 and the shield case 200.

It is sufficient that the soldered portion 140 connect the conductive portion 149 and at least one side of the opening edge of the shield case 200. It should be noted that it is preferable that the soldered portion 140 be provided near the core wire connection portion 130. With this, resistance to interference from an unwanted external signal, which is so called a noise, can be strengthened. Furthermore, the soldered portions 140 may be provided to surround the core wire connection portion 130. With this, resistance to interference from noise can be strengthened.

Furthermore, it is desired that a connection area between the shield case 200 and the conductive portion 149 be wide to (i) decrease impedance that is an electrical resistance component between the conductive portion 149 of the printed wiring board 100 and the shield case 200 and (ii) strengthen resistance to interference from noise to improve reception performance.

However, when a soldered portion is provided to extend along one side of the opening edge of the shield case 200, with a typical heating method and the solder paste 142 of a common type, the inventors found that solder flows at the time of heating for soldering, and connection failure occurs.

In view of this, in this embodiment, soldered portions each in an island shape to form land areas 143 are disposed along a side of the opening edge of the shield case 200. With this, even with a typical heating method and solder of a common type, a connection area can be widened while reducing flowing of solder during soldering and avoiding connection failure. It should be noted that a method for forming the soldered portion in an island shape will be described later.

When an electronic component or the like included in another signal processing system on the printed wiring board 100 operates, a interfering signal is generated that causes a change in potential of the conductive portion 149 connected to a ground. The slit 150 is a portion for reducing chances where the interfering signal reaches near the core wire connection portion 130. The slit 150 has, as a space, a lower permittivity compared to the resist 101. In this embodiment, the slit 150 has a lowest permittivity in the printed wiring board 100. The slit 150 is provided on an RF component 110 side of the shield case 200, that is, on a core wire connection portion 130 side, and is provided on the printed wiring board 100 along one side of the opening edge of the shield case 200.

The ground via 160 is a via that connects, across layers in a thickness direction of the printed wiring board 100, portions connected to the ground of the conductive portions 149 that are disposed in the layers in the thickness direction. The ground via 160 is provided at a plurality of positions that are along the slit 150, between the slit 150 and the core wire connection portion 130, and on the RF component 110 side. With this, electrical impedance can be reduced for a portion of the conductive portion 149 connected to the ground of the printed wiring board 100, and resistance to interference from noise can be strengthened.

Next, a process for automatically mounting the shield case 200 to the printed wiring board 100 using a machine is described with reference to FIG. 4 to FIG. 10.

Figure 4:
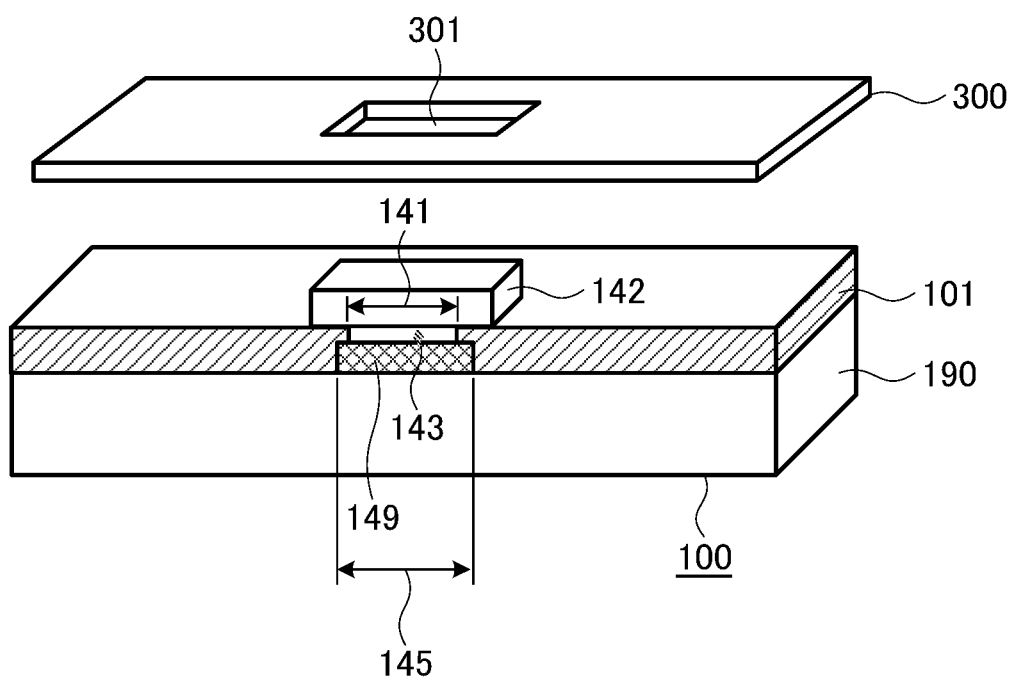
FIG. 4 is a perspective view illustrating relationship between a metal mask and a printed wiring board according to Embodiment 1.

FIG. 4 is a perspective view illustrating a relationship between a metal mask and a printed wiring board according to Embodiment 1.

Figure 5:
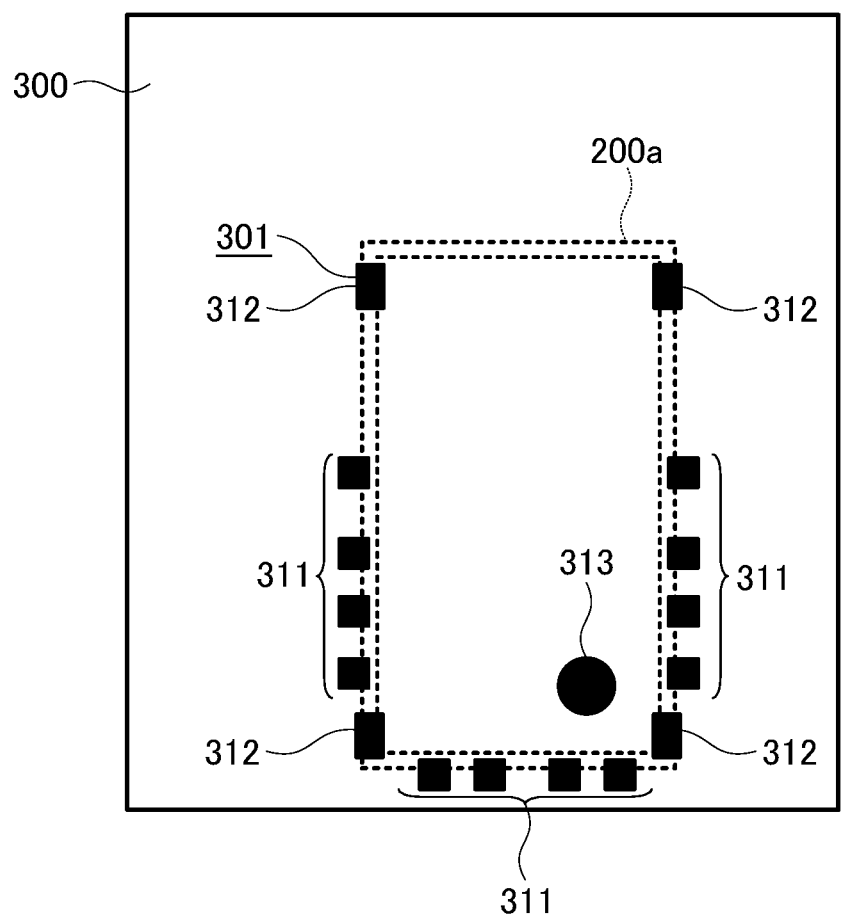
FIG. 5 is a plan view illustrating a metal mask opening according to Embodiment 1.

FIG. 5 is a plan view illustrating an opening of a metal mask opening according to Embodiment 1.

Figure 6:
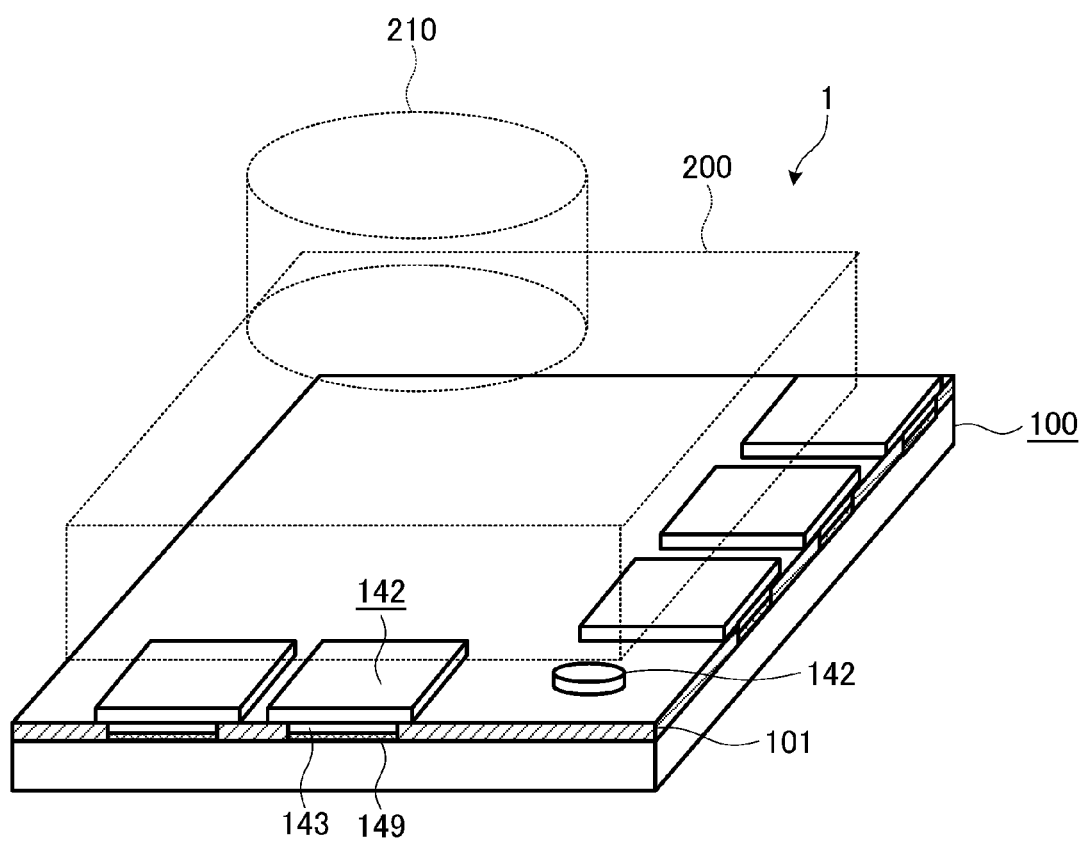
FIG. 6 is a perspective view in which a shield case is omitted to illustrate relationships among a conductive portion, a resist opening, and solder paste according to Embodiment 1.
Figure 7:
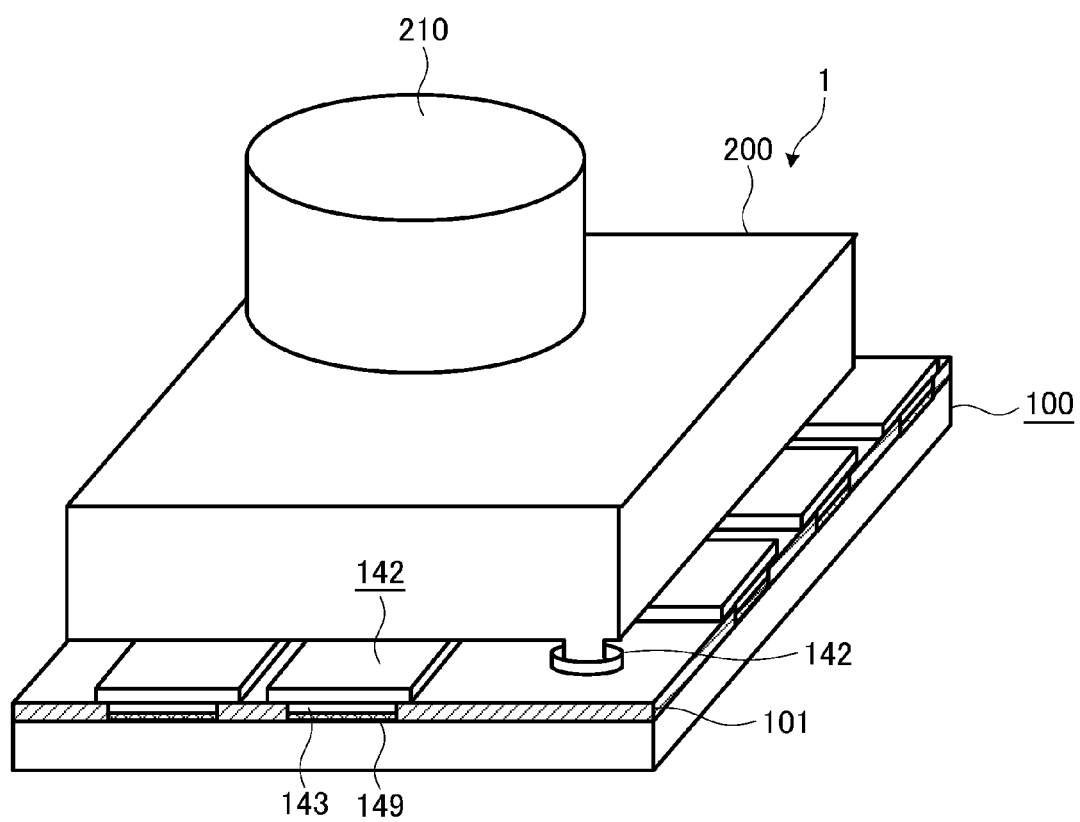
FIG. 7 is a perspective view illustrating relationships among the conductive portion, the resist opening, the solder paste, and the shield case according to Embodiment 1.

FIG. 6 and FIG. 7 are perspective views illustrating relationships among a conductive portion, a resist opening, solder paste, a shield case according to Embodiment 1.

Figure 8:
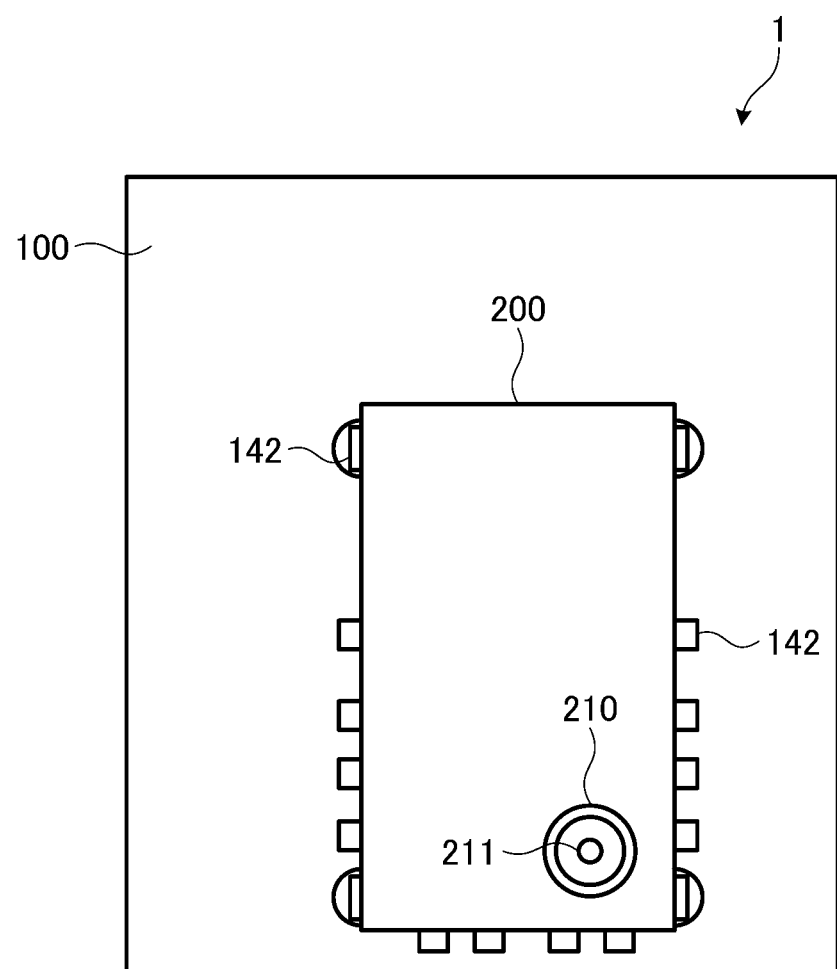
FIG. 8 is a plan view illustrating a state in which a shield case is connected to the printed wiring board according to Embodiment 1.

FIG. 8 is a plan view illustrating a state in which a shield case is connected with solder according to Embodiment 1.

Figure 9:
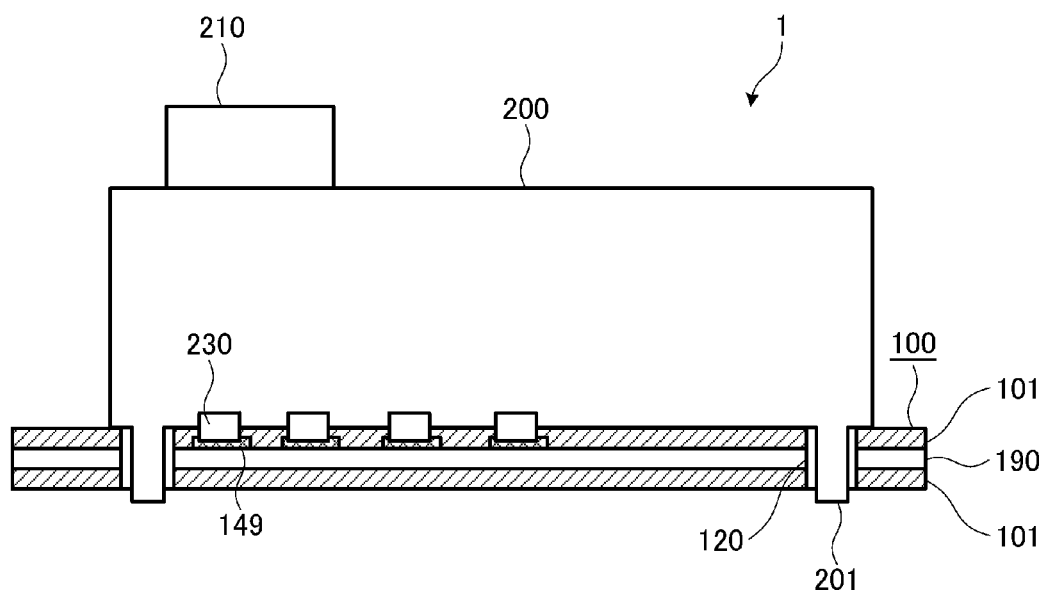
FIG. 9 is a side view illustrating a state in which the shield case is connected to the printed wiring board according to Embodiment 1.

FIG. 9 is a side view illustrating the state in which the shield case is connected with solder according to Embodiment 1.

Figure 10:
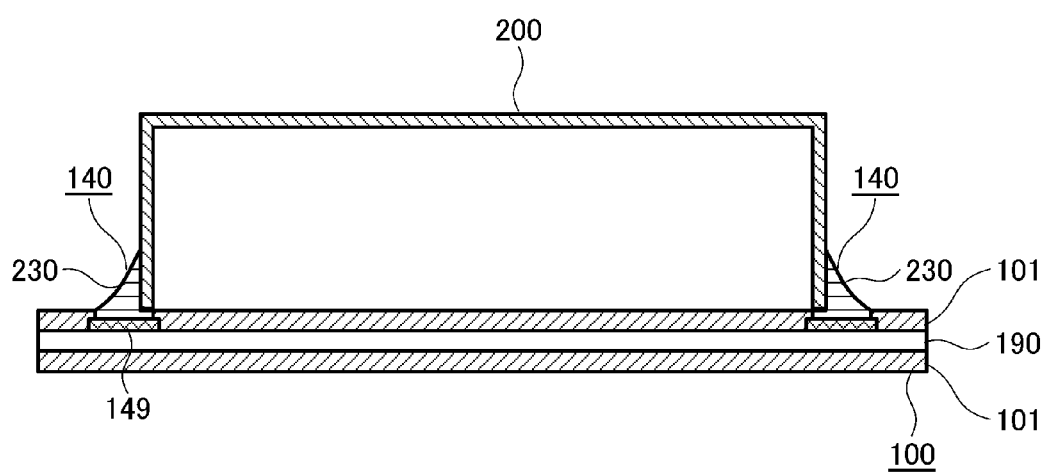
FIG. 10 is a side view illustrating an inside of the shield case after connecting with solder according to Embodiment 1.

FIG. 10 is a partial cutaway side view of the shield case, illustrating a state of connection with solder according to Embodiment 1.

In FIG. 4, on a surface layer portion of the printed wiring board 100, the resist 101 that is dielectric that does not conduct electricity is present, and the land 143 for electrical conduction with the conductive portion 149 of the printed wiring board 100 is provided. A width of the conductive portion 149 that corresponds to the land 143 is called a conductive portion width 145. The portion of the land 143 surrounded by the resist 101 and is visually recognizable when viewed from directly above a surface of the printed wiring board is called a resist opening 141.

The solder paste 142 for connecting the shield case 200 with solder is applied on the resist opening 141. The shield case 200 is connected to the conductive portion 149 that is exposed to the land 143 when the applied solder paste 142 melts at the time of reflow, that is to say, due to application of heat, and a soldered portion is formed due to cooling. With this, the shield case 200 is electrically and mechanically connected to the conductive portion 149 provided on the printed wiring board 100.

The solder paste 142 is applied with a method described below, for example. The solder paste 142 is applied using a metal mask 300 including a metal mask opening 301 of a predetermined pattern. The solder paste 142 that passes through the metal mask opening 301, which is an opened portion, adheres onto the resist 101, and thus the solder paste 142 is applied. Typically, a thickness of the solder paste 142 (i.e., height relative to the surface of the printed wiring board 100) depends on a thickness of the metal mask 300. In this embodiment, the thickness is 0.5 mm.

Furthermore, in FIG. 4, the conductive portion 149 is designed to have a slightly larger area than the land 143. This makes it possible to prevent detachment of the conductive portion 149 from the printed wiring board 100, and improve efficiency of heat transfer when the solder paste 142 is melted. It should be noted that the conductive portion 149 connected to the ground of the printed wiring board 100 is provided to cover a large area in many cases. In such cases, the conductive portion width 145 of the conductive portion 149 connected to the ground has significantly larger area relative to the resist opening 141.

FIG. 5 illustrates a pattern of the metal mask opening 301 of the metal mask 300. The metal mask 300 is a component for determining an application pattern of the solder paste 142 that is necessary when the shield case 200 is connected to the printed wiring board 100 with solder, and is a component for eventually forming a pattern of the soldered portion 140. In the drawing, dotted lines schematically indicate relative positional relationship of an opening edge 200a of the shield case 200. The opening edge 200a of the shield case 200 and the conductive portion 149 of the printed wiring board 100 are connected using the solder paste 142. Thus, the metal mask 300 includes, at a corresponding position, the first opening 311 that is the metal mask opening 301 for applying the solder paste 142. The second opening 312 that is a metal mask opening is provided at a position corresponding to the through hole 120, which is for the protrusion 201 of the shield case 200, as well. The second opening 312 is positioned to extend over a center of a thickness of the shield case 200. Furthermore, the metal mask 300 includes a third opening 313 at a position corresponding to the core wire connection portion 130. The third opening 313 is positioned to be a center of the core wire connection portion 130. On the other hand, the first opening 311 that forms the soldered portion 140 is positioned such that the solder paste 142 (i) is not applied inside relative to an interior edge of the opening edge 200a and (ii) is applied outside relative to the interior edge of the opening edge 200a. With this, even when the shield case 200 is soldered to the printed wiring board 100, it is possible to reduce chances where the solder reaches an inner wall of the shield case 200. This makes it possible to easily remove the shield case 200 from the printed wiring board 100 by melting the solder again.

FIG. 6 illustrates the printed wiring board 100 in a state in which the solder paste 142 is applied through the metal mask 300. FIG. 7 illustrates a state in which the shield case 200 is placed on the printed wiring board 100 to which the solder paste 142 is applied.

As illustrated in FIG. 6 and FIG. 7, in a state in which the shield case 200 is placed on the printed wiring board 100 to which the solder paste 142 is already applied, the protrusion 201 of the shield case 200 is disposed inside the through hole 120 penetrating through the solder paste 142. After soldering, a fillet 230 (see FIG. 9 and FIG. 10) is formed between a side surface of the shield case 200 and the conductive portion 149. This realizes connection, with solder, having good quality with high conductivity and high connection strength.

FIG. 8 illustrates from above the state in which the shield case 200 is placed on the printed wiring board 100 to which the solder paste 142 is already applied. An edge of the solder paste 142 that is applied at a position corresponding to the opening edge of the shield case 200 contacts and extends along an interior edge of the opening edge of the shield case 200. Insertion of the protrusion 201 into the through hole 120 causes the solder paste 142 that is applied at a position corresponding to the protrusion 201 of the shield case 200 to enter inside the through hole 120. In this state, heating and melting using a reflow furnace or the like, and cooling are performed. This enables to connect with solder the shield case 200 and the conductive portion 149 of the printed wiring board 100 through the protrusion 201.

Each of FIG. 9 and FIG. 10 illustrates a state in which the shield case 200 and the conductive portion 149 of the printed wiring board 100 are already connected with solder through reflow mounting that is heating and cooling. The solder paste 142 applied at a position corresponding to the opening edge of the shield case 200 forms, on a side surface of the shield case 200, a fillet 230 due to the heating. The fillet 230 is formed only on an outside of the shield case 200. Thus, even after the soldering, the shield case 200 can be easily removed by melting the fillet 230 using a soldering iron or the like. This makes it easy to remove the shield case 200 from the printed wiring board 100.

Figure 11:
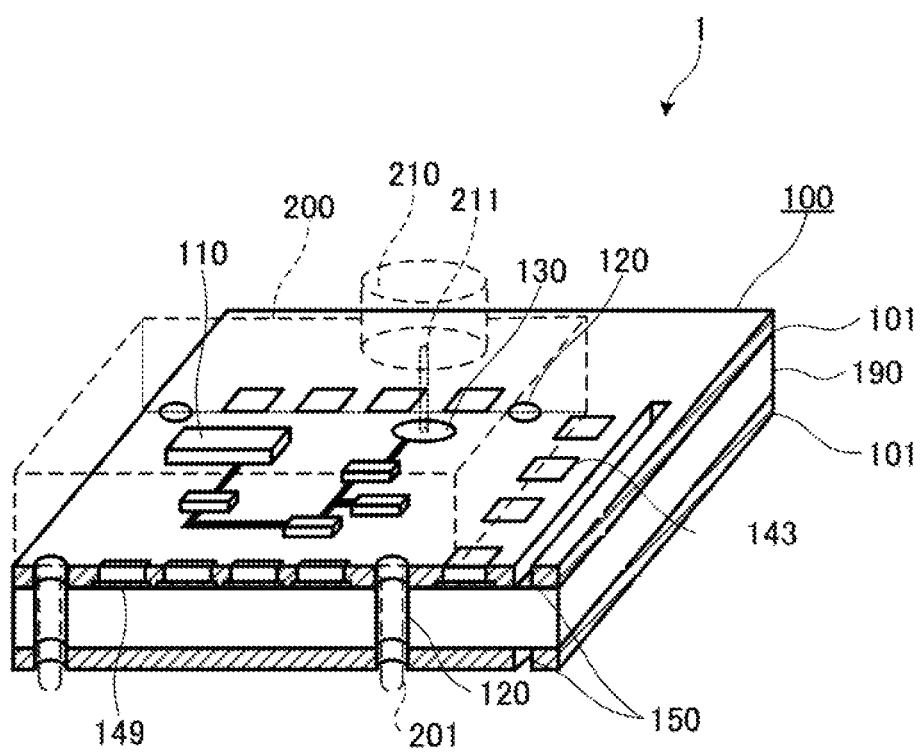
FIG. 11 is a perspective view of a receiving device in which a slit is provided outside the shield case according to Embodiment 1.

It should be noted that the slit 150 needs not be covered by the shield case 200. As illustrated in FIG. 11, seen from the RF component 110, the slit 150 may be disposed outside of the solder fillet 230 (outside of the shield case 200). In this case, an advantageous effect is produced in which an interfering signal, which is not intended for the receiving device 1, is kept off from the shield case 200 and resistance to interference is further strengthened.

It should be noted that the printed wiring board 100 needs not include the slit 150. In this case, it is assumed that sufficient performance is ensured with the shield case 200 and the connection of the solder fiilet 230.

Figure 12:
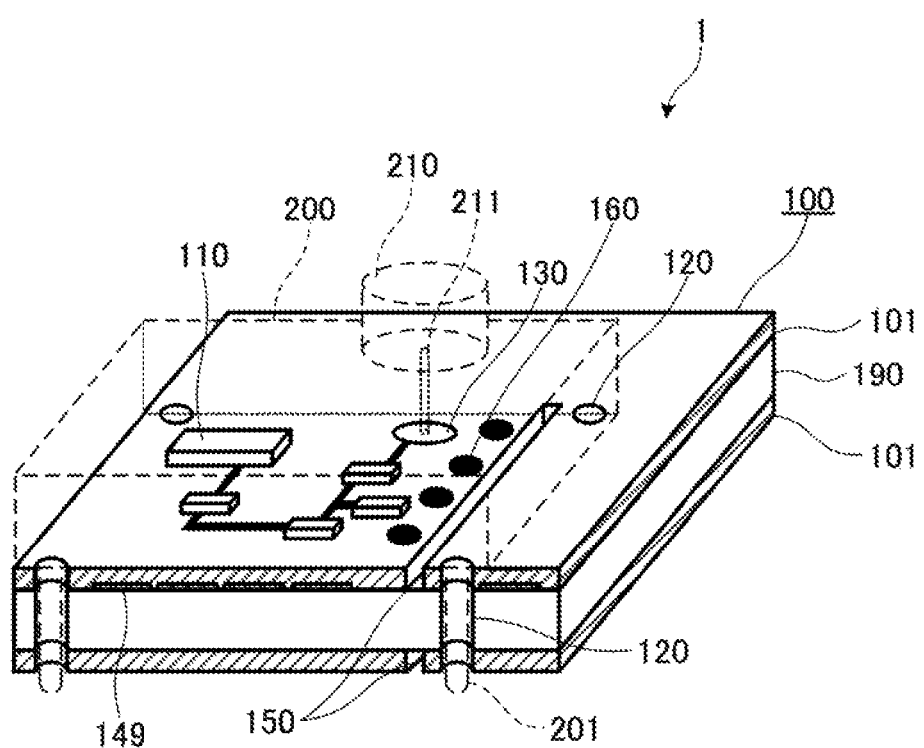
FIG. 12 is a perspective view of a receiving device for describing an effect produced by a slit in a hypothetical case in which a soldered portion is absent.

Here, a function of the slit 150 is described. As illustrated in FIG. 12, even in a hypothetical case where the soldered portion 140 is not provided, although impedance between the shield case 200 and the conductive portion 149 connected to the ground of the printed wiring board 100 increases, there are cases where the slit 150 can sufficiently reduce the interfering signals on the printed wiring board 100.

Figure 13:
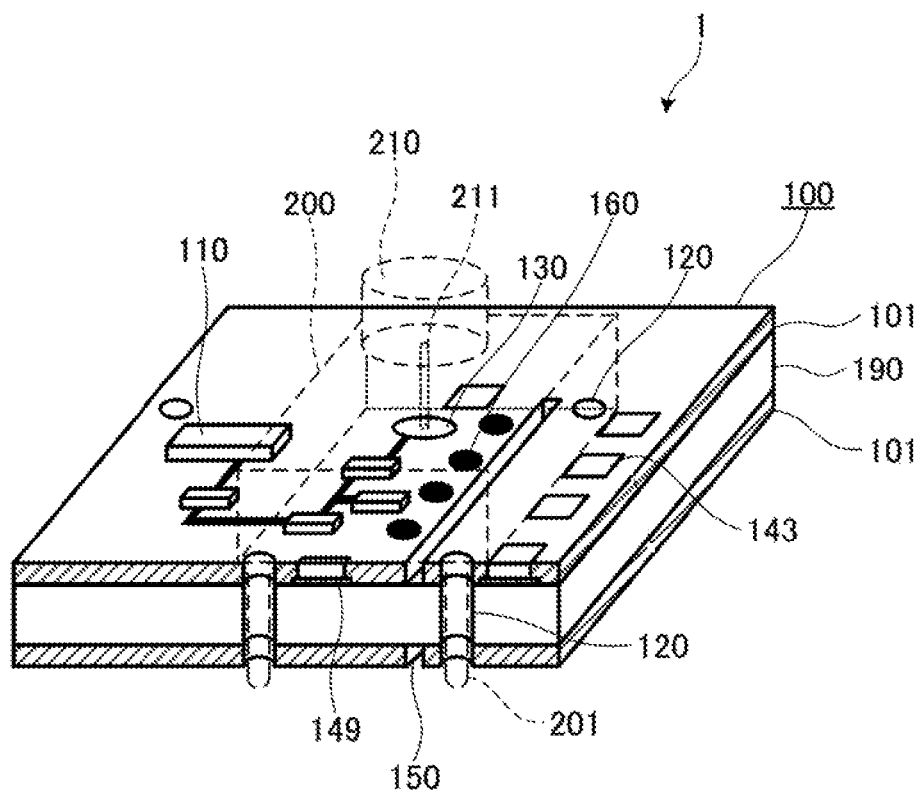
FIG. 13 is a perspective view of a receiving device including a shield case according to another aspect of Embodiment 1.

It should be noted that, as illustrated in FIG. 13, one or more of the RF components 110 need not necessarily be covered by the shield case 200. When the shield case 200 covers the core wire connection portion 130, resistance to interference can be ensured for the core wire connection portion 130.

In this embodiment, the core wire connection portion 130 is a portion for connecting, with solder, the core wire 211 of the input connector 210 to the conductive portion 149 of the printed wiring board 100. It should be noted that the core wire connection portion 130 may be a hole or have a shape that allows connection to the conductive portion 149 with solder in a surface layer of the printed wiring board 100. In this case, it is possible to prevent a case where the core wire 211 of the input connector 210 penetrates the printed wiring board 100 penetrating a rear side of the printed wiring board 100 to be more susceptible to interference from outside.

It should be noted that the ground via 160 may be provided on a side different from a side where the RF component 110 is provided. In this case, a direction in which the interfering signal flows in the printed wiring board 100 can be effectively changed. Furthermore, providing the ground via 160 along three or less sides out of four sides of the opening edge of the shield case 200 makes it possible to strengthen resistance to interference.

It should be noted that the soldered portion 140 connects the shield case 200 and the conductive portion 149 of the printed wiring board 100, and is not limited to the soldered portion 140 that is disposed to have an island shape. This embodiment does not exclude the solder fillet 230 provided to form a stripe or the like along a side of the opening edge of the shield case 200. With the solder fillet 230 that extends along a side of the opening edge as described, electrical connection between the shield case 200 and the printed wiring board 100 can be strengthened. This produces an advantageous effect of high resistance to interference.

It should be noted that the shield case 200 is formed from a metal, typically iron, which is electrically conductive. However, the shield case 200 may include an insulator as long as a ground portion of the input connector 210 can be electrically connected, through the shield case 200, to the conductive portion 149 that is connected to a ground of the printed wiring board 100. In this case, it is assumed that electricity does not flow to the shield case 200, and it is possible to keep an effect from the interfering signal small that results from another component and a structure near the shield case 200.

It should be noted that the thickness of the metal mask 300 is not limited to the above-described 0.5 mm. A thickness of the solder paste 142 changes depending on a thickness of the metal mask 300. Thus, there is a case where a size of the opening of the metal mask opening 301 is changed to adjust an amount of the solder paste 142 applied on the printed wiring board 100.

[1-3. Advantageous Effect Etc.]

The receiving device 1 and a shield case connection method according to the present disclosure can maintain or improve reception performance. This is because the slit 150 or the ground via 160 that is provided on the printed wiring board 100, and the solder fillet 230 for connecting the shield case 200 reduce unwanted interfering signals, which are generated on the printed wiring board 100 or the like, that reach the core wire 211.

Embodiment 2

Subsequently, a receiving device 1 according to non-limiting Embodiment 2 of the present disclosure is described. It should be noted that a portion corresponding with Embodiment 1 is given the same reference sign and the description thereof is omitted to describe mainly a point different from Embodiment 1.

When an RF component 110 or the like that realizes a tuner function is mounted on a portion of a printed wiring board 100 to which an electronic component that realizes a system other than the tuner function is connected, the portion that realizes the tuner function is called an on-board tuner. Furthermore, the printed wiring board 100 on which the RF component 110 or the like that realizes a sole tuner function is housed, to form one piece, in a shield case 200 that is in a box shape and does not include a large opening is called a tuner module (can tuner). The present disclosure describes the printed wiring board 100 that can be used in common for the on-board tuner and for the tuner module, while strengthening resistance of the on-board tuner to interference.

Figure 14:
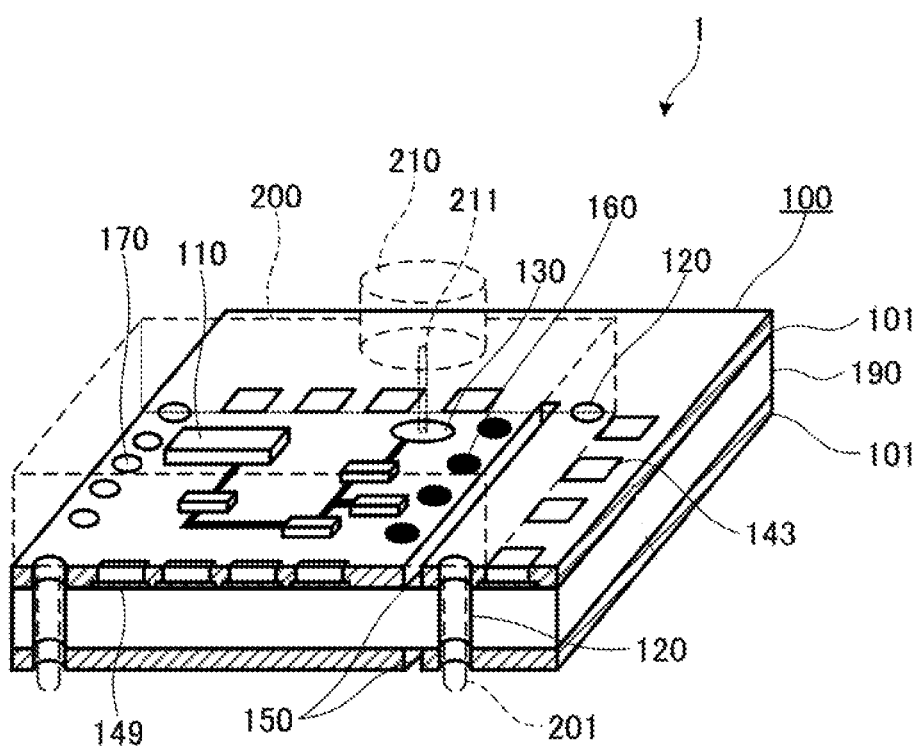
FIG. 14 is a perspective view illustrating a configuration of a receiving device according to Embodiment 2.

FIG. 14 is a perspective view illustrating a configuration of a receiving device according to Embodiment 2.

Figure 15:
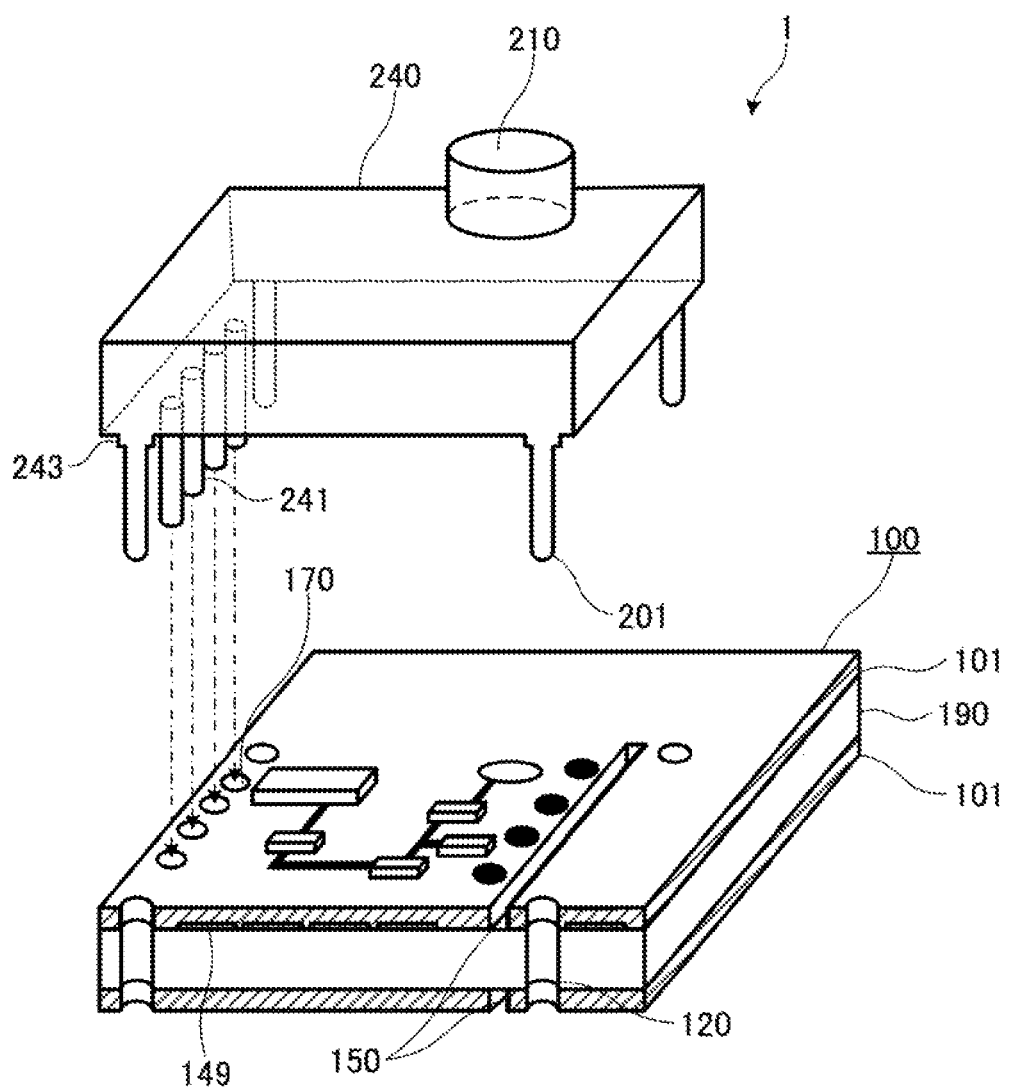
FIG. 15 is a perspective view in which a tuner module and a printed wiring board according to Embodiment 2 are arranged.

FIG. 15 is a perspective view in which a tuner module and a printed wiring board according to Embodiment 2 are arranged.

Figure 16:
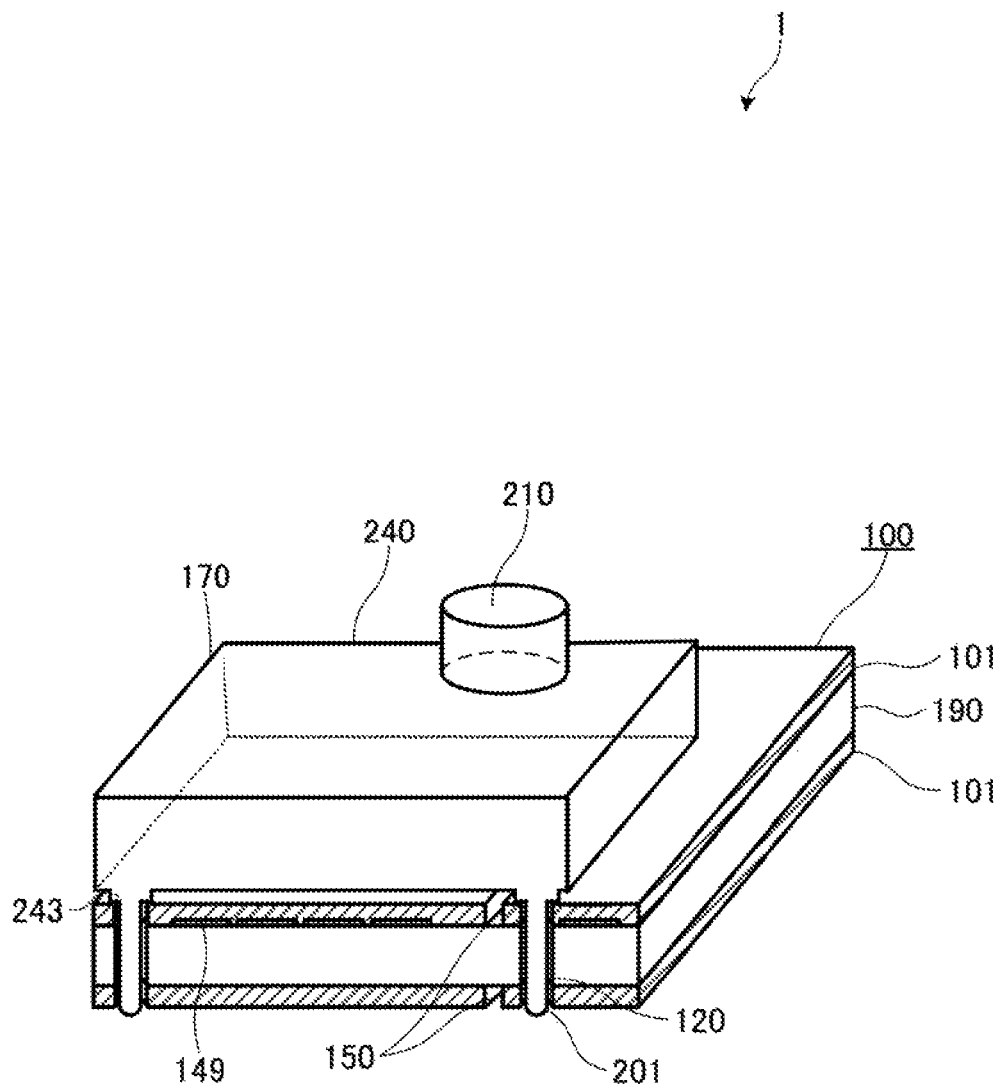
FIG. 16 is a perspective view illustrating appearances of the receiving device according to Embodiment 2.

FIG. 16 is a perspective view illustrating appearances of a receiving device according to Embodiment 2.

In FIG. 14, the receiving device 1 includes: the printed wiring board 100, the RF component 110, a through hole 120, a core wire connection portion 130, and the shield case 200. The receiving device 1 further includes a second through hole 170 to which an input and output pin 241 (see FIG. 15) of a tuner module 240 is inserted when the tuner module 240 is mounted without mounting the shield case 200.

FIG. 15 and FIG. 16 illustrate states before and after the tuner module 240, instead of the shield case 200, is attached to the printed wiring board 100. As illustrated in these drawings, the receiving device 1 includes the tuner module 240 in which the RF component 110 is housed as a module component.

The input and output pin 241 is provided to the tuner module 240, which is for sending and receiving a signal between the outside and the RF component 110 or the like that is housed inside. A protrusion 201 is provided to the tuner module 240, which is inserted to the through hole 120 when the tuner module 240 is mounted on the printed wiring board 100. The input and output pin 241 is configured to be insertable into the second through hole 170 when the protrusion 201 of the tuner module 240 is inserted in the through hole 120. Thus, the tuner module 240 can be mounted on the printed wiring board 100. Specifically, selection is possible between mounting, on the printed wiring board 100, (i) the RF component 110 and the shield case 200 as the on-board tuner and (ii) the tuner module 240. Regardless of whether the on board tuner or the tuner module 240 is adopted, the function as the receiving device 1 can be realized. Thus, the printed wiring board 100 can include, as a common board, two or more types of specifications of the receiving device 1.

Here, the tuner module 240 includes a base portion 243 in a proximal portion of the protrusion 201. The base portion 243 is a portion that is provided to avoid contact between a bottom portion of the tuner module 240 and a soldered portion 140. It should be noted that a thickness of solder paste 142 applied through the metal mask 300 is approximately the same as a thickness of a metal mask 300. Thus, it is preferable that a height of the base portion 243 be higher than the thickness of the metal mask 300 that is used. For example, when the thickness of the metal mask 300 is 0.5 mm, it is preferable that the height of the base portion 243 be greater than or equal to 0.6 mm.

It should be noted that the height of the base portion 243 is not limited to greater than or equal to 0.6 mm, and the thickness of the solder paste 142 is not limited to 0.5 mm. In this case, adjustment is possible by designing the height of the base portion 243 of the protrusion 201 of the tuner module to be greater than or equal to the thickness of the metal mask.

[2-3. Advantageous Effect Etc.]

In the receiving device 1 according to the present disclosure, the second through hole 170 is provided on the printed wiring board 100. This makes it possible to provide the printed wiring board 100 that can be commonly used, allowing selection between adoption of the on-board tuner and the tuner module. Thus, it is possible to arbitrarily select a level of (i) the interfering signal reduction effect and (ii) the reception performance.

Embodiment 3

Next, a receiving device 1 according to non-limiting Embodiment 3 of the present disclosure is described. It should be noted that a portion corresponding with Embodiment 1 is given the same reference sign and the description thereof is omitted to describe mainly a point different from Embodiment 1.

There are cases where a shield case 200 is formed by folding one sheet of a metal plate into a rectangular box shape. In this case, the shield case 200 includes a joining portion 250 having a mating structure to join edges of two sides of the metal plate that abut each other when the metal plate is folded. In this embodiment, solder paste 142 is applied below the joining portion 250 as well, and a printed wiring board 100 on which the shield case 200 is placed is heated using a reflow furnace. With this, the solder paste 142 applied below the joining portion 250 melts to reach the joining portion 250. With subsequent cooling, the second soldered portion 148 including a second fillet 231 is formed. This makes it possible to increase mechanical strength of the shield case 200. As described above, in this embodiment, the second soldered portion 148 is formed at a same point in time as formation of a soldered portion 140.

Figure 17:
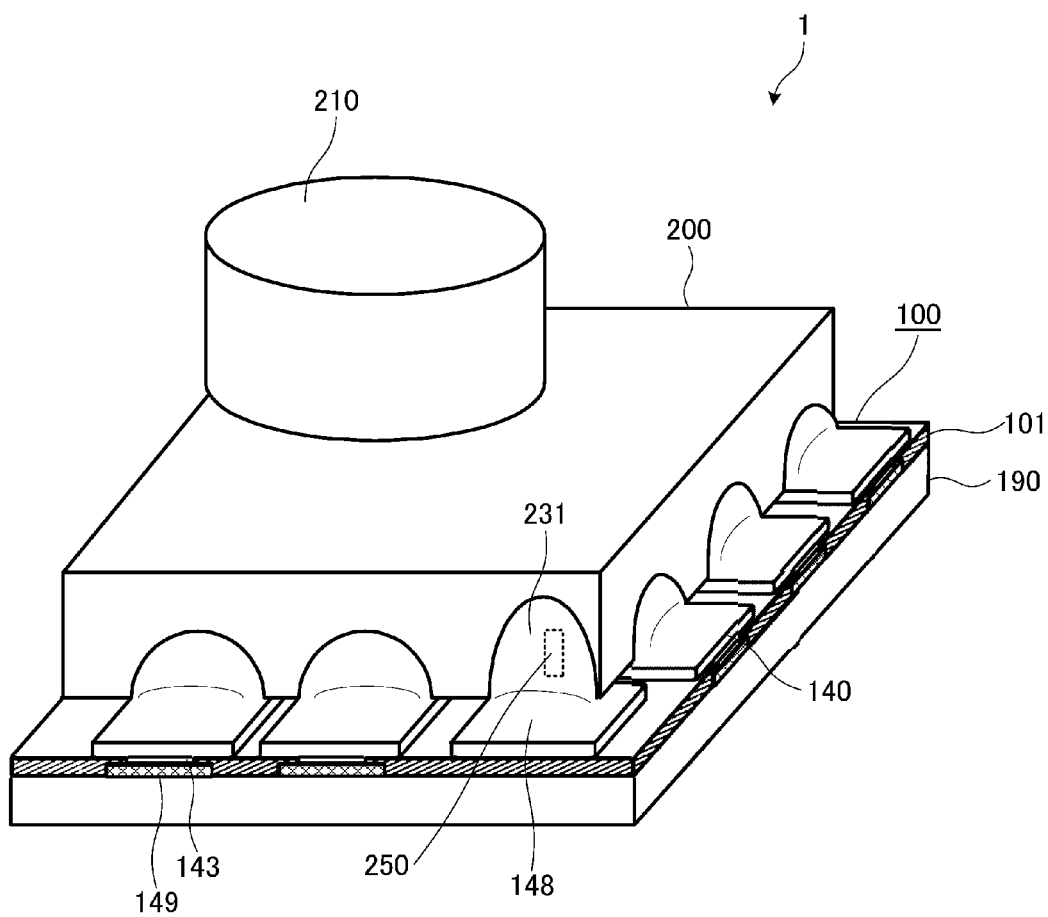
FIG. 17 is a perspective view illustrating a state in which a joining portion of a shield case is strengthened by solder according to Embodiment 3.

FIG. 17 is a perspective view illustrating a state in which a joining portion of a shield case is strengthened with a second soldered portion according to Embodiment 3.

As illustrated in FIG. 17, the receiving device 1 includes the printed wiring board 100 and the shield case 200. The solder paste 142 applied on a land 143 melts at the time of reflow, and subsequently cooled to form the soldered portion 140 including a fillet 230. With this, the shield case 200 and a conductive portion 149 electrically conduct. On the other hand, at a same point in time, the solder paste 142 melts which is applied on a portion that is directly below the joining portion 250 of the shield case 200 and is where the land 143 is not provided. With this, the solder reaches the joining portion 250, and the joining portion 250 of the shield case 200 is connected with solder due to subsequent cooling. With this, the second soldered portion 148 including the second fillet 231 is formed that increases mechanical strength of the shield case 200.

It should be noted that when the solder paste 142 is applied directly below the joining portion 250 of the shield case 200, the land 143 may be provided directly below the joining portion 250. In this case, solder fills the land 143, and thus an amount of the solder paste 142 to be applied may be increased to allow solder to reach the joining portion 250.

[3-3. Advantageous Effect Etc.]

In the receiving device 1 and the shield case connection method according to the present disclosure, the solder paste 142 is additionally applied to directly below the joining portion 250 of the shield case 200 when the shield case 200 is mounted on the printed wiring board 100. With this, the mechanical strength of the shield case 200 can be improved. Furthermore, the interfering signals are reduced, and reception performance can be maintained and improved.

Embodiment 4

Next, a receiving device 1 according to non-limiting Embodiment 4 of the present disclosure is described. It should be noted that a portion corresponding with Embodiment 1 is given the same reference sign and the description thereof is omitted to describe mainly a point different from Embodiment 1.

An unnecessary signal from a system other than a tuner function is called an interfering wave. In particular, an interfering wave, inside and outside of an electric device, in the air resulting from an operation of a device is called radiation. In this embodiment, the receiving device 1 including countermeasures for radiation is described. Resistance to interference from the radiation that reaches along a printed wiring board 100 is strengthened with a shield case 200 above a tuner and a configuration, such as a slit 150 or the like, of the printed wiring board 100.

Figure 18:
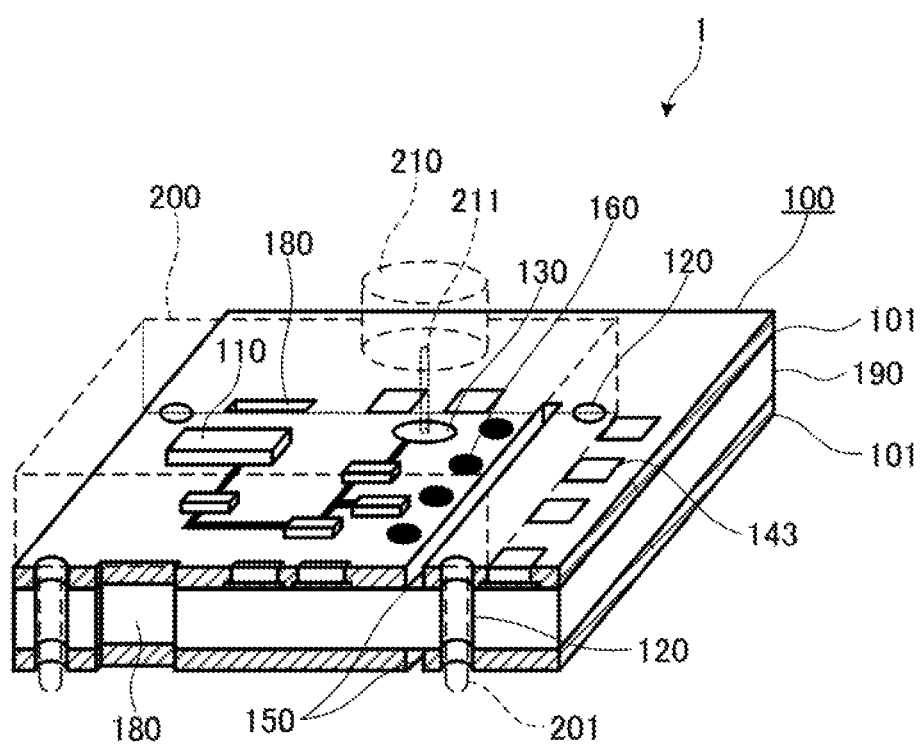
FIG. 18 is a perspective view illustrating a configuration of a receiving device according to Embodiment 4.

FIG. 18 is a perspective view illustrating a configuration of a receiving device according to Embodiment 4.

Figure 19:
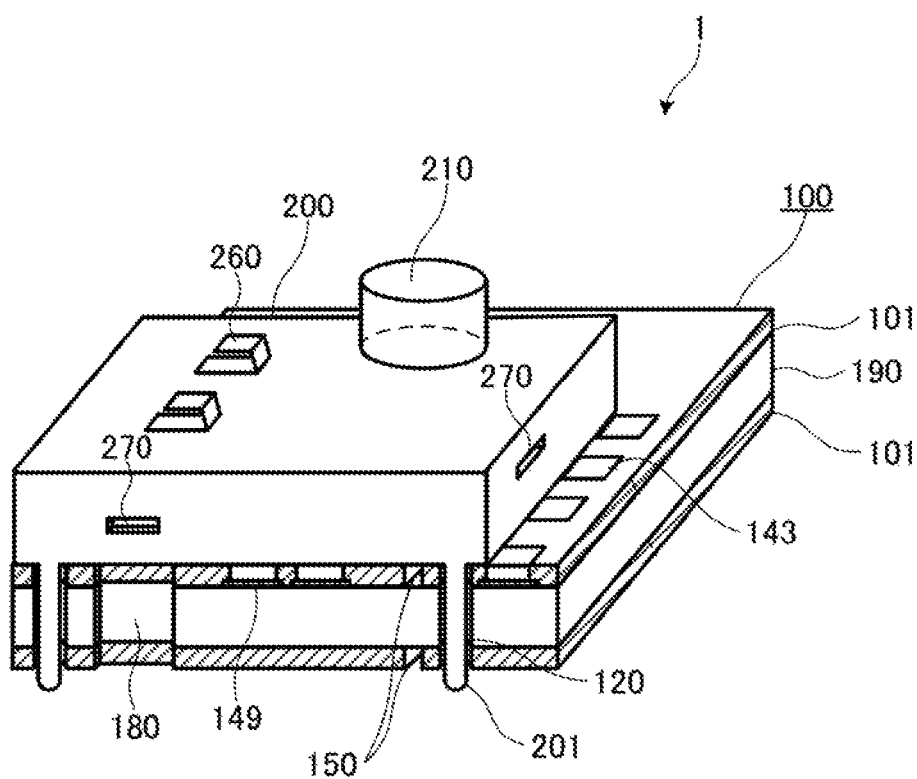
FIG. 19 is a perspective view illustrating appearances of the receiving device according to Embodiment 4.

FIG. 19 is a perspective view illustrating appearances of the receiving device according to Embodiment 4.

Figure 20:
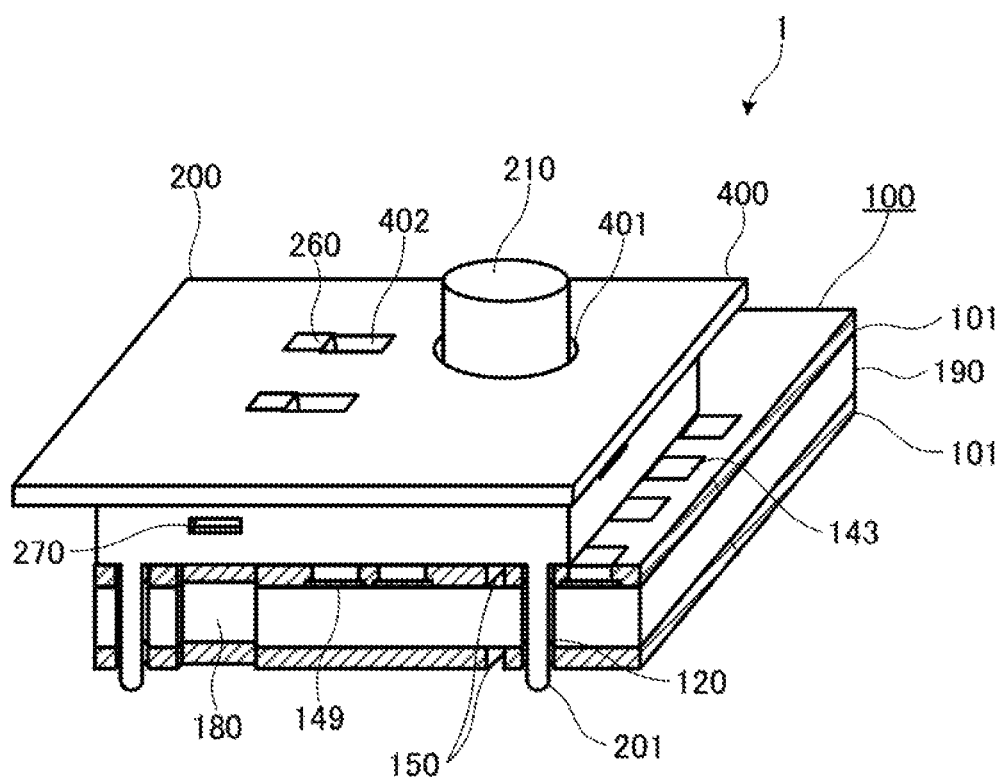
FIG. 20 is a perspective view in which a shield case and a shield plate according to Embodiment 4 are assembled.

FIG. 20 is a perspective view illustrating a relationship between a shield case and a shield plate according to Embodiment 4.

In this embodiment, the receiving device 1 includes: the printed wiring board 100, an RF component 110, a soldered portion 140, a third through hole 180, and the shield case 200.

With the soldered portion 140, the shield case 200 electrically conducts with a conductive portion 149 that is connected to a ground of the printed wiring board 100. Furthermore, a protruding portion 260 is provided on an upper surface of the shield case 200. In this embodiment, the protruding portion 260 is a portion formed by cutting a portion of an upper surface portion of the shield case 200 and flipping upward the cut portion. The protruding portion 260 has a hook-like structure which hooks a flat plate, and is a portion for connecting a shield plate 400, which will be described later, and the shield case 200.

The shield plate 400 includes a first through hole 401 and a second through hole 402 that penetrate through the shield plate 400 in a thickness direction. With the first through hole 401 that allows an input connector 210 to pass through, and the second through hole 402 that is hooked on the protruding portion 260, the shield plate 400 can be connected to the shield case 200. The receiving device 1 is influenced by an external interfering wave, and thus includes the shield case 200. The receiving device 1 additionally includes the shield plate 400 to strengthen resistance to the radiation. Furthermore, the soldered portion 140 electrically connects the shield case 200 to the conductive portion 149 that is connected to the ground of the printed wiring board 100. Furthermore, the shield case 200 is between the printed wiring board 100 and the shield plate 400. Thus, a large shielding effect is produced.

Next, a configuration is described that strengthen resistance to interference from the radiation originated from below (a side opposite to a side on which the shield case 200 is attached) the printed wiring board 100.

Figure 21:
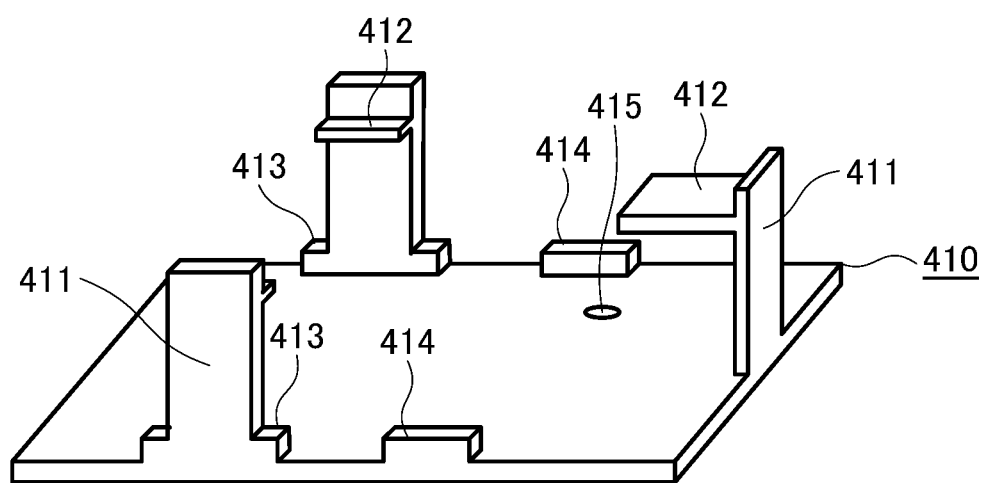
FIG. 21 is a perspective view illustrating appearances of a rear cover according to Embodiment 4.

FIG. 21 is a perspective view illustrating appearances of a rear cover according to Embodiment 4.

Figure 22:
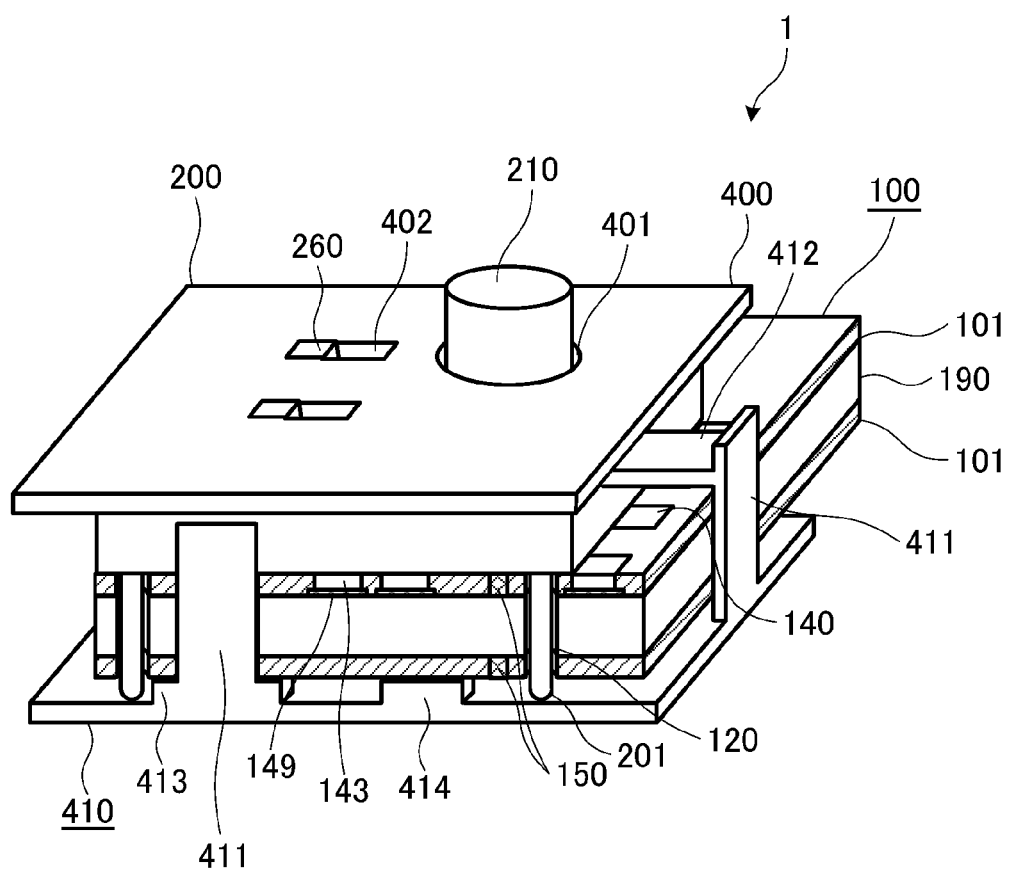
FIG. 22 is a perspective view in which a shield case, a shield plate, and a rear cover are assembled according to Embodiment 4.

FIG. 22 is a perspective view in which a shield case, a shield plate, and a rear cover are assembled according to Embodiment 4.

As illustrated in FIG. 21 and FIG. 22, the receiving device 1 further includes a rear cover 410. The rear cover 410 includes: a fastening foot 411, a hook 412, a second base portion 413, an auxiliary base portion 414, and a core wire protective hole 415.

The fastening foot 411 extends upward to join the rear cover 410 and the shield case 200. The hook 412 is in a tip portion of the fastening foot 411, and protrudes toward the shield case 200. The hook 412 and a receiving portion 270, which is a recess provided on the shield case 200, contacts each other to be engaged. The rear cover 410 and the shield case 200 can be thus fixed. Furthermore, the third through hole 180 included in the printed wiring board 100 is provided to allow the fastening foot 411 to pass through the printed wiring board 100 from the rear to the front. The second base portion 413 that is provided on the rear cover 410 is provided in a proximal portion of the fastening foot 411 to be in contact with the printed wiring board 100. This is for avoiding uneven portion on a rear side of the printed wiring board 100 and reliably fixing the shield case 200 and the rear cover 410.

To further enhance the fixing, the rear cover 410 further includes the auxiliary base portion 414 to be in contact with the printed wiring board 100. The core wire protective hole 415 is provided on the rear cover 410, which is for avoiding contact between the rear cover 410 and a core wire 211 which extends from the input connector 210 attached to the shield case 200 and is disposed to stick out from the rear side of the printed wiring board 100. The radiation received by the receiving device 1 includes influence from the rear side of the board, and resistance to interference can be strengthened by attaching the rear cover 410 to the shield case 200.

It should be noted that, as illustrated in FIG. 22, both the shield plate 400 and the rear cover 410 may be attached to the shield case 200. In this case, influence from interfering waves both from above and below the receiving device 1 can be reduced, and thus the resistance to interference can be further strengthened. It should be noted that one of the shield plate 400 and the rear cover 410 may be attached to the shield case 200.

It should be noted that the protruding portion 260 may have a spring-like property. In this case, the shield plate 400 is not attached as an independent component. Instead, a metal component (e.g., an iron structural component), such as a rear cover of a television that structurally reinforces the television, is brought into contact with the shield case 200. With this, the protruding portion 260 is pressed against the shield plate 400. Thus, the grounding of the receiving device 1 is strengthened and resistance to interference can be strengthened.

It should be noted that the rear cover 410 needs not include the core wire protective hole 415. In this case, to avoid contact between the core wire 211 and the rear cover 410, the length of the core wire 211 that sticks out of a rear side of the printed wiring board 100 may be shorter than a height of the second base portion 413 and a height of the auxiliary base portion 414.

[4-3. Advantageous Effect Etc.]

In the receiving device 1 and the shield case connection method according to the present disclosure, the protruding portion 260 is provided on the upper surface of the shield case 200, and the receiving portion 270 is provided on the side face of the shield case 200, and thus the shield plate 400 and the rear cover 410 can be connected to the shield case 200. This makes it possible to reduce external interfering signals, such as radiation, from outside, and maintain reception performance.

As above, the embodiments are described as examples of a technique according to the present disclosure. The accompanying drawings and detailed descriptions are provided for such a purpose.

Thus, the structural elements described in the accompanying drawings and the detailed descriptions include not only structural elements indispensable to solve a problem but may also include structural elements not necessarily indispensable to solve the problem to provide examples of the above-described mounting. Therefore, structural elements not necessarily indispensable should not be immediately asserted to be indispensable for the reason that such structural elements are described in the accompanying drawings and the detailed descriptions.

Furthermore, the above-described embodiments show examples of the technique according to the present disclosure. Thus, various modifications, replacements, additions, omissions, or the like can be made in the scope of CLAIMS or in a scope equivalent to the scope of CLAIMS.

INDUSTRIAL APPLICABILITY

The present disclosure can reduce, in a communication apparatus that receives a radio wave or in a wireless communication terminal, an influence from interference from a signal other than a wanted signal, and thus is useful as an apparatus which can reduce a cost for necessary countermeasures against interference or as an apparatus which can efficiently maintain a reception performance in various environments.

The invention claimed is:

1. A receiving device comprising:
a shield case which is in a hollow box shape that is open on one side, the shield case reducing external interfering signals which interfere with an input signal of a broadcast wave; and
a printed wiring board including a conductive portion that is electrically connected with an electronic component,
wherein
a soldered portion is formed along a protrusion-free linearly extending side of an opening edge of the shield case, the soldered portion electrically connecting with solder the shield case and the conductive portion of the printed wiring board,
the shield case includes an input connector,
the printed wiring board includes a core wire connection portion to be connected with a core wire included in the input connector, and a front resist layer over the conductive portion on a front surface of the printed wiring board,
the soldered portion is provided for, from among sides of the opening edge of the shield case, a side that is disposed closest to the core wire connection portion, and
the receiving device further comprises a front slit formed in the front resist layer in a position inside the shield case, the front slit dividing a portion of the conductive portion that is disposed near the core wire connection portion, the front slit being formed by boring only the front resist layer and blocks electrical conduction, and the front slit having a lower permittivity compared to the front resist layer.

2. The receiving device according to claim 1, wherein a plurality of the soldered portions are disposed at positions along a side of the opening edge.

3. The receiving device according to claim 1, wherein the shield case includes a protrusion that protrudes from the opening edge,
the printed wiring board has a through hole into which the protrusion of the shield case is inserted,
the through hole is provided at a position in which the conductive portion is disposed, the conductive portion being electrically connected with a ground of the printed wiring board, and
the soldered portion connects the protrusion and the through hole in a state where the protrusion is inserted in the through hole.

4. The receiving device according to claim 1, wherein the soldered portion includes a fillet only outside of the shield case.

5. The receiving device according to claim 1, wherein the soldered portion is not formed at least along one of four sides of the opening edge of the shield case.

6. The receiving device according to claim 1, further comprising:
a back resist layer on a back surface of the printed wiring board, and
a back slit formed in the back resist layer at a same position as the front.

7. The receiving device according to claim 1, wherein the shield case covers at least a space above the core wire connection portion.

8. The receiving device according to claim 1, wherein the shield case is formed by folding a metal plate, and includes a joining portion having a mating structure for joining edges of two sides of the metal plate that abut each other when the metal plate is folded, and a second soldered portion is formed that connects the joining portion with solder, at a same point in time as the formation of the soldered portion that connects with solder the shield case and the conductive portion.

9. The receiving device according to claim 1, wherein the shield case includes a protruding portion on an upper surface of the shield case that is a surface facing the printed wiring board, the protruding portion being urged in a protruding direction, and the protruding portion is pressed against a metal structural component that structurally reinforces the receiving device.

10. The receiving device according to claim 1, wherein the shield case includes a protruding portion on an upper surface of the shield case that is a surface facing the printed wiring board, the protruding portion protruding upward, the receiving device further comprising a shield plate held on the upper surface of the shield case by the protruding portion, the shield plate having an area larger than an area of the upper surface of the shield case.

11. The receiving device according to claim 1, further comprising a rear cover that is disposed on a side of the printed wiring board opposite a side on which the shield case is disposed, the rear cover being attached to cover the opening edge of the shield case.

12. The receiving device according to claim 1, wherein the printed wiring board has a second through hole into which an input and output pin of a tuner module is inserted.

13. The receiving device according to claim 12, wherein the tuner module includes a protrusion, and the tuner module includes, in a proximal portion of the protrusion, a base portion having a height greater than or equal to a thickness of solder paste applied on the printed wiring board.

\* \* \* \* \*